United States Patent [19]

Wada et al.

[11] Patent Number: 4,969,116

[45] Date of Patent: Nov. 6, 1990

[54] METHOD OF GENERATING DISCRETIZATION GRID FOR FINITE-DIFFERENCE SIMULATION

[75] Inventors: Tetsunori Wada, Kamakura; Shinji Oosawa, Tokyo, both of Japan

[73] Assignee: Kabushiki Kaisha Toshiba, Kawasaki, Japan

[21] Appl. No.: 251,165

[22] Filed: Sep. 28, 1988

[30] Foreign Application Priority Data

Sep. 29, 1987 [JP] Japan ................... 62-242585

[51] Int. Cl.⁵ .............................. G06F 15/60
[52] U.S. Cl. ................... 364/578; 364/488; 364/491
[58] Field of Search .............. 364/578, 488–491

[56] References Cited

U.S. PATENT DOCUMENTS

| | | | |
|---|---|---|---|
| 4,754,408 | 6/1988 | Carpenter et al. | 364/488 |
| 4,789,945 | 12/1988 | Niijima | 364/489 |
| 4,802,099 | 1/1989 | Logue | 364/488 |
| 4,809,202 | 2/1989 | Wolfram | 364/578 |
| 4,812,962 | 3/1989 | Witt | 364/488 |
| 4,829,446 | 5/1989 | Draney | 364/488 |
| 4,835,705 | 5/1989 | Fujino et al. | 364/488 |
| 4,837,447 | 6/1989 | Pierce et al. | 364/490 |
| 4,839,821 | 6/1989 | Murakata | 364/488 |
| 4,843,563 | 6/1989 | Takahashi et al. | 364/489 |

Primary Examiner—Parshotam S. Lall
Assistant Examiner—Christopher L. Makay
Attorney, Agent, or Firm—Foley & Lardner, Schwartz, Jeffery, Schwaab, Mack, Blumenthal & Evans

[57] ABSTRACT

A method of generating a discretization grid for a finite-difference simulation capable of simulating an object with a complex cross-sectional configuration accurately is disclosed. The method includes the step of generating grid through each vertex of the polygonal figure representing the cross-sectional configuration, and the step of generating additional grid through each intersection of the grid and the segments of the polygonal figure not parallel to the grid.

18 Claims, 8 Drawing Sheets

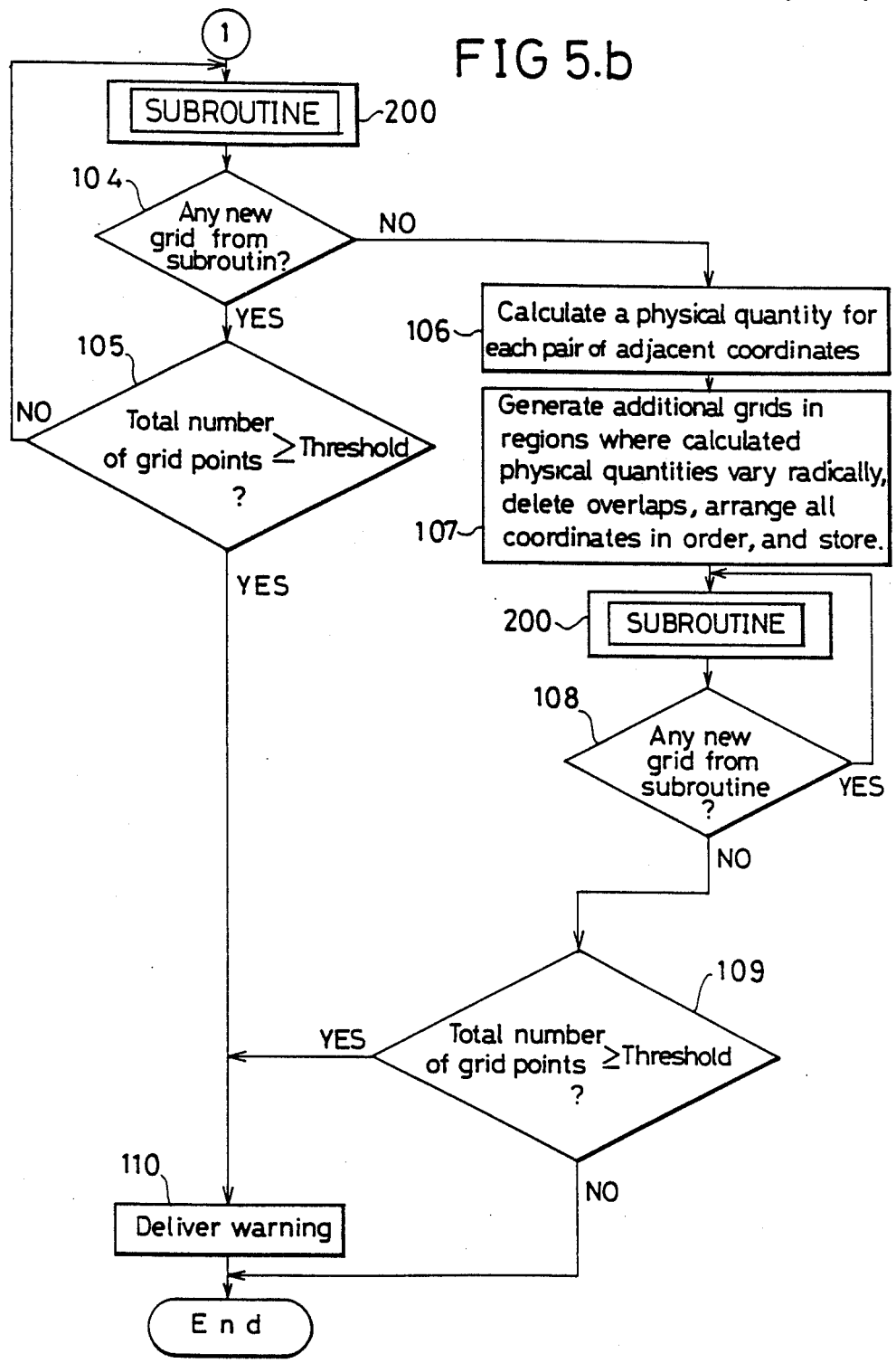
FIG 5.b

'SUBROUTINE 200'

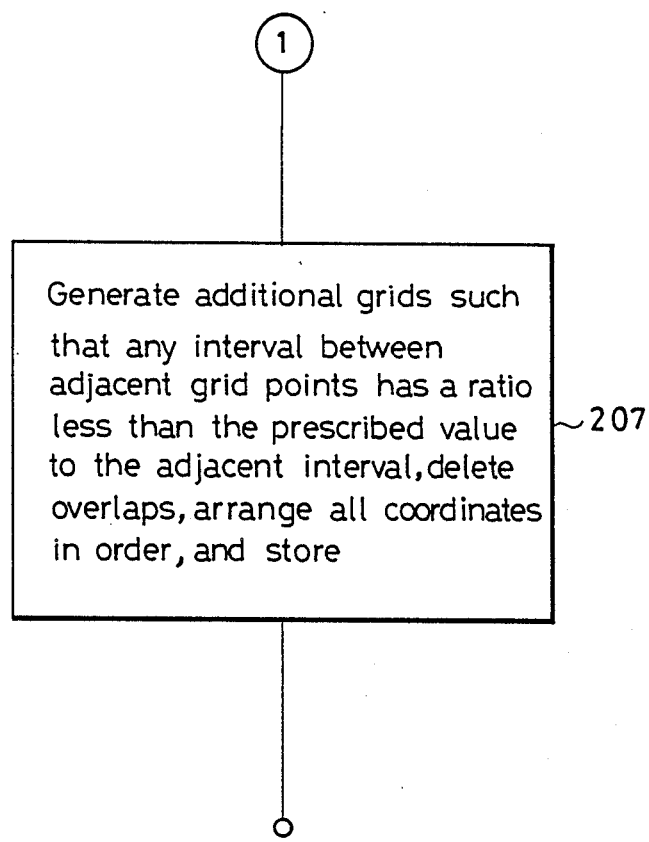

METHOD OF GENERATING DISCRETIZATION GRID FOR FINITE-DIFFERENCE SIMULATION

BACKGROUND OF THE INVENTION

1. Field of the Invention

The present invention relates to a numerical simulation technique known as a finite-difference simulation and, more particularly, to a method of generating a discretization grid necessary for finite-difference simulation.

2. Description of the Prior Art

A numerical simulation technique known as finite-difference simulation is particularly useful in analyzing Voltage-Current characteristic and response characteristic of semi-conductor devices (See, for example, S. Selberherr "Analysis and Simulation of Semiconductor Devices" Springer-Verlag, Wien, 1984).

In the finite-difference simulation, a discretization grid is superimposed on the cross-sectional figure of a semi-conductor device to be simulated, as shown in FIG. 1. Here, in order to improve accuracy of simulation, separations between adjacent intersections of a vertical line and a horizontal line (referred hereafter simply as grid points) are reduced near boundaries of different materials such as a boundary 3 between semi-conductor base 1 and insulator medium 2, or peripheral region 5 of the electrode medium 4. The discretization grid is generated such that grid points lie on these boundaries. The physical quantities such as potentials, electron densities etc. are calculated on these grid points, and prediction or evaluation of the Voltage-Current characteristic, the response characteristic etc. are derived from these simulated quantities. The discretization grid used for finite-difference simulation most commonly is a rectangular grid such as the one shown in FIG. 1.

However, as semi-conductor devices become more highly integrated, a cross-sectional figure of the device becomes more complicated such that boundaries between different materials may include segments which are not parallel to the rectangular grid. Though it is possible to simulate such a semi-conductor device with a complex cross-sectional figure by the conventional finite-difference simulation using a rectangular grid, as shown in FIG. 2 where the grid is generated so that there is a grid point over each vertex of the boundary 6, it is extremely difficult to generate such a grid which satisfies all of the following requirements:

(a) there is a grid point over each vertex of the cross-sectional figure;

(b) there is a grid point where a line of the rectangular grid crosses a segment of the cross-sectional figure which is not parallel to the grid;

(c) separations between adjacent grid points vary gradually without a radical change, and the grid is finer around boundaries of different materials;

(d) the grid can be generated automatically.

In addition, it is very difficult to generate enough grid points on segments of the figure not parallel to the rectangular grid so as to maintain satisfactory accuracy of the simulation.

To cope with this situation, a method has been proposed in which the cross-sectional figure of the device is covered by triangles such that each vertex of the cross-sectional figure coincide with a vertex of a triangle, as shown in FIG. 3 (See, for example, S.E. Laux and R.J. Lomax "Numerical Investigation of Mesh Size Convergence Rate of the Finite Element Method in MESFFT Simulation" Solid State Electronics Vol. 24, P485, 1981). In this method, complicated figures like a boundary surface 7 and electrodes 8 can be simulated.

However, this method has the following problems:

(a) an obtuse triangle must be avoided in order to maintain the high accuracy of the simulation;

(b) it is very difficult to generate a triangular grid automatically which has grid points over all verticles of the cross-sectional figure, and which is finer around boundaries of different materials and becomes coarser gradually elsewhere;

(c) calculations required for the simulation with a triangular grid involve matrices in which non-zero elements appears irregularly. For example, a configuration shown in FIG. 4(A) requires calculations involving a matrix shown in FIG. 4(B) where a non-zero element is represented by star symbols. This requires a computer with a larger memory capacity than that normally required for a simulation with a rectangular grid, and consequently renders the method impractical.

SUMMARY OF THE INVENTION

It is therefore an object of the present invention to provide a method of generating a discretization grid for a finite-difference simulation which satisfies the following requirements:

(a) there is a grid point over each vertex of a cross-sectional figure of an object to be simulated;

(b) there is a grid point over each intersection of the grid and segments of the cross-sectional figure of the object that are not parallel to the grid;

(c) the grid becomes coarser or finer gradually;

(d) the grid is finer around boundaries of different materials;

(e) the grid is generated automatically. so that objects with complex structures can be handled with high accuracy without increasing a memory capacity of a computer.

This object is achieved in the present invention by providing a method of generating a discretization grid for a finite-difference simulation in which particular physical quantities are calculated on grid points of the discretization grid, the method comprising the steps of:

(a) generating a rectangular grid to locate one grid point over each vertex of a polygonal figure representing an object to be simulated;

(b) generating an additional rectangular grid to locate one grid point over each intersection of the rectangular grid generated at the step (a) and segments of the polygonal figure which are not parallel to lines of the rectangular grid.

Other features and advantages of the present invention will become apparent from the following description taken in conjunction with the accompanying drawings.

BRIEF DESCRIPTION OF THE DRAWINGS

FIGS. 5(A) and 5(B) is a main flow chart of a method for generating a discretization grid according to the present invention.

DETAILED DESCRIPTION OF THE PREFERRED EMBODIMENTS

One embodiment of a method of generating a discretization grid for a finite-difference simulation according to the present invention will now be described with references to the FIGS. 5, 6, 7, and 8.

In this embodiment, the method is executed by an ordinary computer equipped with CPU, ROM, RAM, input device, output device, etc. All calculations and other operations needed at each step of the method are carried out by CPU and all memorization of information needed in the method are handled by RAM or other memory devices.

Figure 1:
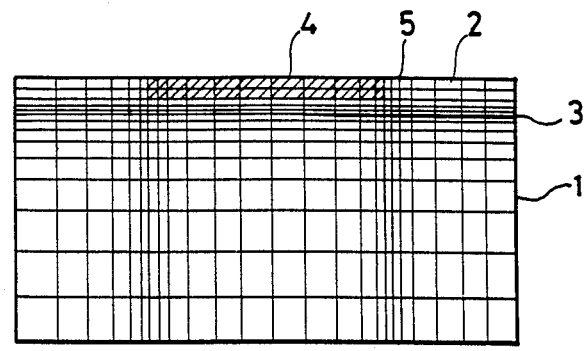
FIG. 1 is an illustration of a rectangular grid of a first prior art method.
Figure 2:
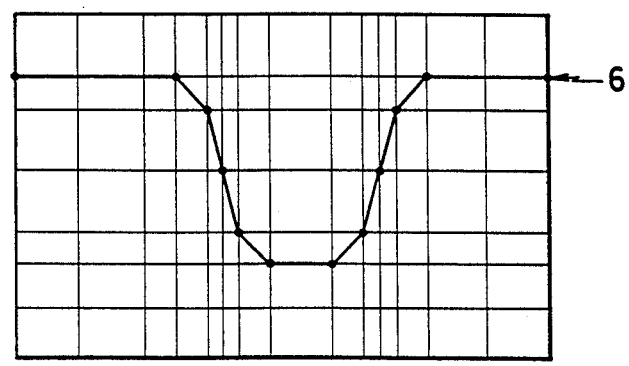
FIG. 2 is an illustration of a rectangular grid to simulate a complicated polygonal figure in the first prior art method.
Figure 3:
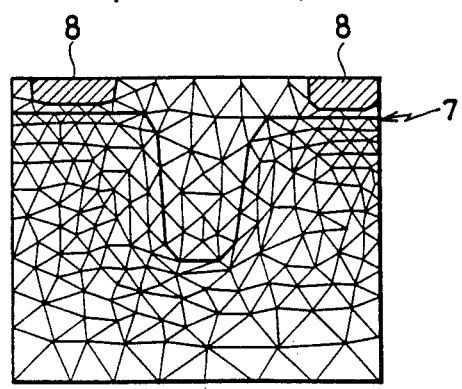
FIG. 3 is an illustration of a triangular grid of a second prior art method.
Figure 4A:
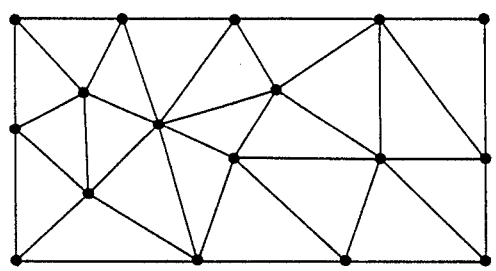
FIG. 4(A) and (B) are illustrations showing a particular configuration of a triangular grid and a matrix involved in calculations required for this configuration, respectively, in the second prior art method.
Figure 4B:
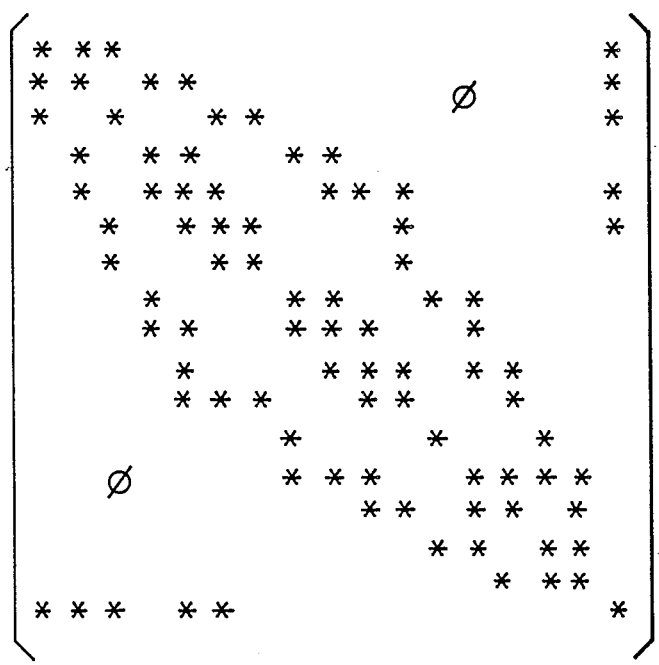
Figure 5A:
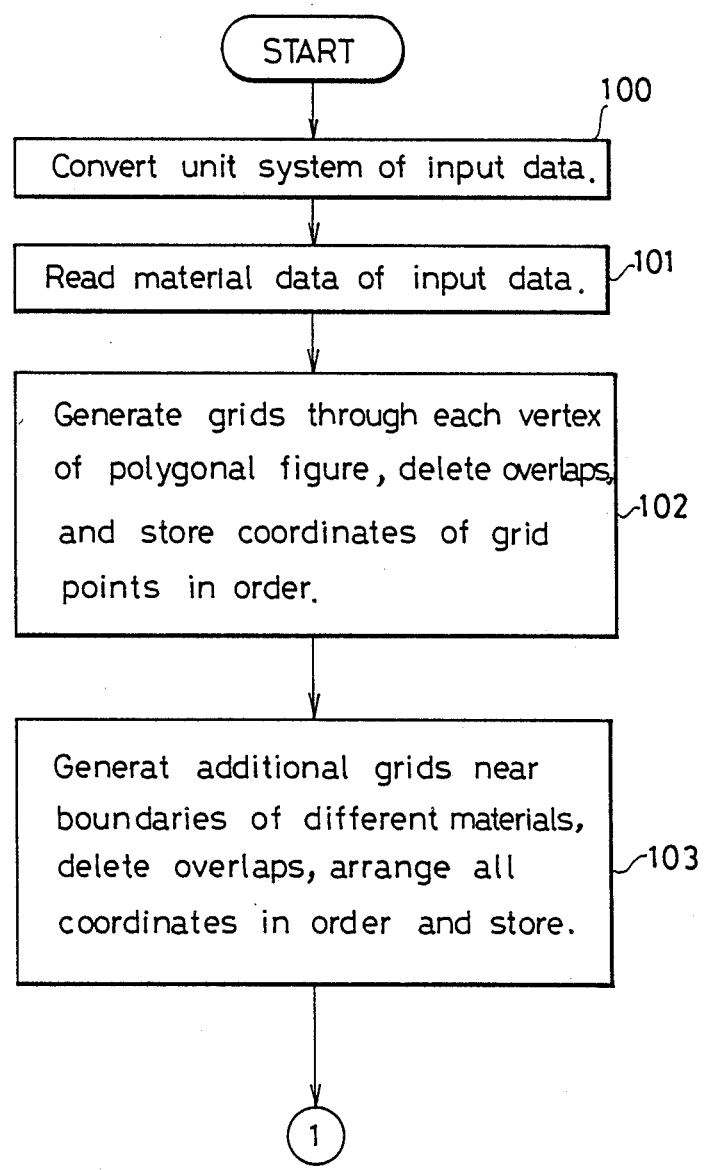

Referring now to FIG. 5, there is shown a main flowchart of this embodiment of the present invention. At the step 100, input data on a polygonal figure representing the inner structures of a semi-conductor device to be simulated are entered and their units are converted into those appropriate for the computer. At the step 101, material data contained in the input data indicating material of each section of the polygonal figure, such as a semi-conductor on an insulator, are read out and stored in the memory. At the step 102, straight lines parallel to the orthogonal coordinate axes (referred hereafter simply as grid lines) are drawn through each vertex of the polygonal figure. Then coordinates with respect to the orthogonal coordinates of points where vertical and horizontal grid lines intersects (referred hereafter simply as grid points) are determined. After removing overlaps, the remaining coordinates are arranged in order and stored in the memory. In this embodiment, any two points are considered overlapping when their separation is less than a prescribed distance. This step 102 ensures that there is a grid point on each vertex of the polygonal figure. At the step 103, boundaries between different materials which are parallel to the orthogonal coordinate axes are identified from the material data obtained at the step 101, and additional grid points and grid lines through them are generated near the identified boundaries so as to reduce the separations between grid lines in this region. Then coordinates of the newly generated grid points are determined, and from all coordinates overlaps are removed while the remaining coordinates are arranged in order and stored in the memory. This step 103 ensures that the grid is finer around boundaries of different materials.

Figure 6A:
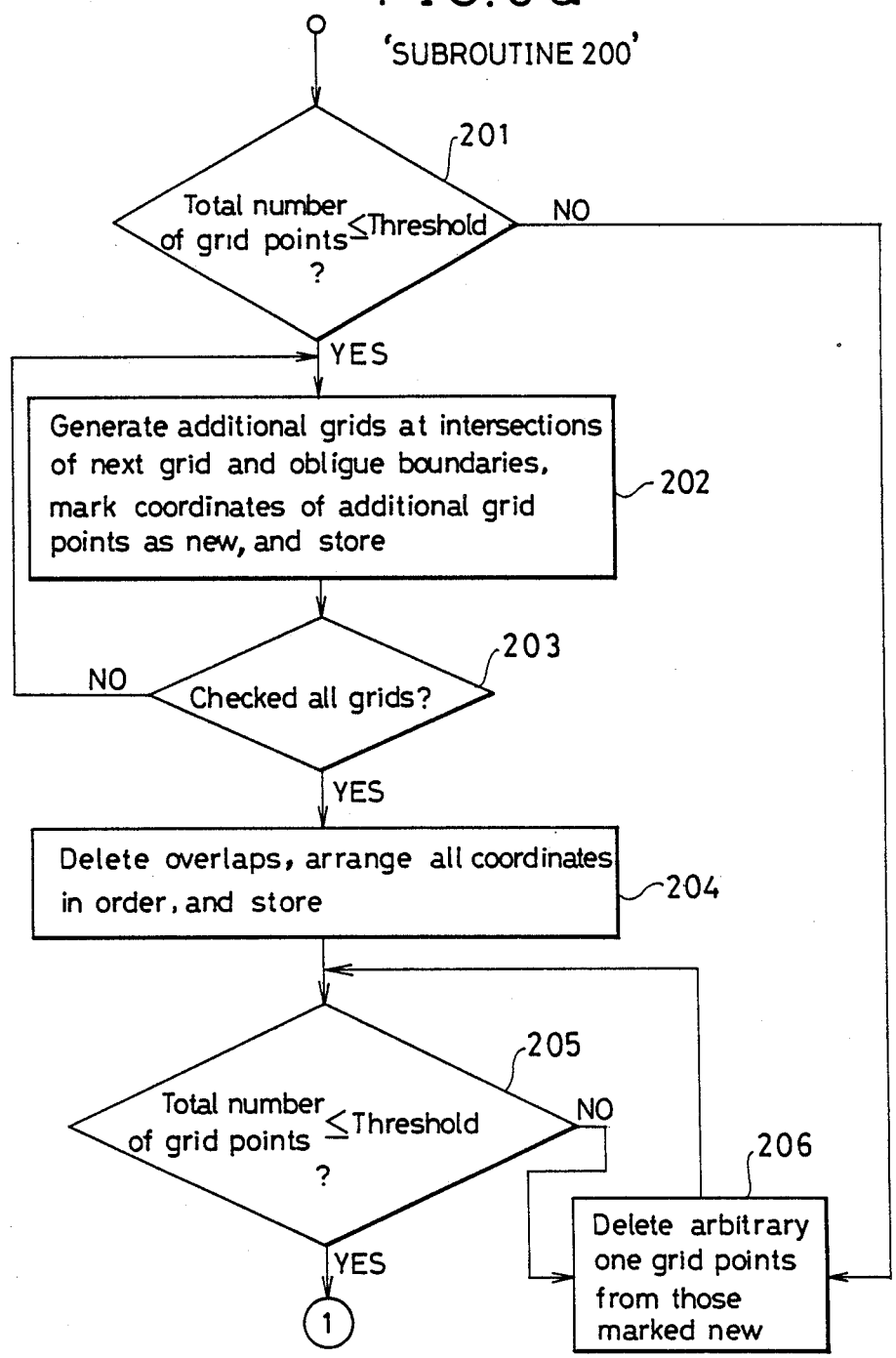
FIG. 6 is a flow chart of a subroutine to be used in the method shown in FIG. 5.

The coordinates stored in the memory at this point are then given to the subroutine 200 shown in FIG. 6. At the step 201, the total number of grid points are compared with a prescribed threshold value. If the total number is greater than the threshold value, the step 206, which will be explained later, will be taken. Otherwise, the step 202 will be taken, where segments of the polygonal figure which are not parallel to the orthogonal coordinate axes (referred hereafter simply as oblique segments) are identified, and further additional grid points and grid lines through them are generated at intersections of one of the grid lines and the identified oblique segments. Then coordinates of the newly generated grid points are determined, marked as new in order to distinguish from those existing before entering this step, and stored in the memory. At the step 203, whether all the grid lines have been checked at the step 202 is determined. If so, the step 204 will be taken. Otherwise, the step 202 is repeated for the next unchecked grid line. At the step 204, from all the coordinates overlaps are removed and the remaining coordinates are arranged in order and stored in the memory. At step 205, the step 201 is repeated except here if the total number is greater than the threshold value, the step 206 will be taken while otherwise the step 207, which will be explained later, will be taken. At the step 206, an arbitrary grid line from those newly generated in the subroutine 200 which is deleted, and then the step 205 will be repeated. This loop formed bY the steps 205 and 206 is intended to remove excessive grid lines. At the step 207, further additional grid points and grid lines through them are generated such that each distance between adjacent grid points has a ratio less than a prescribed ratio to the adjacent distance. This can be done, for example, by repeatedly taking an arithmetic mean of the adjacent coordinates and generating new grid points and grid lines through them at that point until the requirement is satisfied. Then the coordinates of the newly generated grid points are determined, and from all the coordinates overlaps are removed and the remaining coordinates are arranged in order and stored in the memory. The subroutine 200 ends at this point. It can be seen that this subroutine 200 ensures by repeated applications of the step 202 that there is a grid point at each intersection of the grid lines and the oblique segments. The subroutine 200 also ensures by the step 207 that the grid becomes coarser or finer gradually. It is worthwhile to mention here that the process of the step 202 may repeat indefinitely when the polygonal figure consists only of oblique segments, in which a new grid line generated at an intersection of one of the grid lines and one of the oblique segments intersects with some other oblique segment and thereby requiring a new grid lines to be generated there, and so on ad infinitum. However, in this embodiment, since any two points are considered overlapping when their separation is less than a prescribed distance as mentioned above, the process of the step 202 will terminate in a finite number of repetition.

Returning to the main flow chart of FIG. 5, the step 104 will be taken next. At the step 104, whether any new grid point had been generated at the subroutine 200 is determined. If so, the step 105 will be taken while otherwise the step 106, which will be explained later, will be taken. At the step 105, the total number of the grid points are compared with the prescribed threshold value used at the step 200. If the total number is less than the threshold value, the subroutine 200 and the step 104 will be repeated so as to generate enough numbers of grid lines, while otherwise the step 110, which will be explained later, will be taken. At the step 106, a physical quantity such as an impurity distribution is calculated for each pair of adjacent grid points. At the step 107, further additional grid points and grid lines through them are generated in regions where the physical quantity calculated at the step 106 varies radically. Then coordinates of the newly generated grid points are determined, and from all coordinates overlaps are removed while the remaining coordinates are arranged in order and stored in the memory.

The coordinates stored in the memory at this point are then given to the subroutine 200 shown in FIG. 6 again so as to take care of the new grid lines from the step 107, and go through the similar process already explained at the first appearance of the subroutine 200. After the subroutine 200, the step 108 will be taken, where the step 104 is repeated except here if any new grid line had been generated by the subroutine 200, the subroutine and this step 108 immediately following it will be repeated so as to take care of these new grid lines. Otherwise the step 109 will be taken where the step 105 will be repeated except here if the total number of grid points is less than the threshold value the process terminates, while otherwise the step 110 will be taken. At the step 110, the warning indicating that the prescribed threshold value for the total number of grid points has been saturated is delivered and then the process terminates.

Figure 7A:
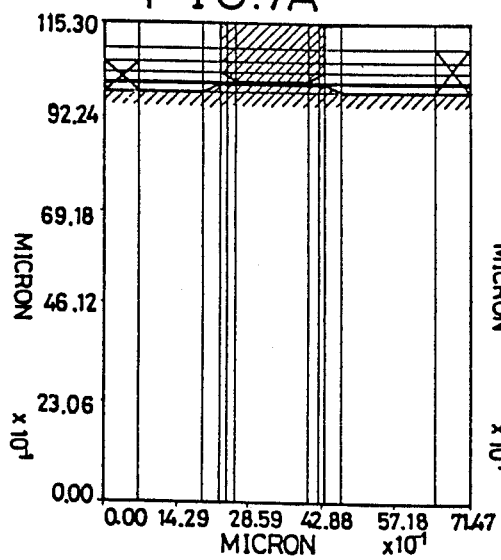
FIG. 7(A), (B), (C) and (D) are illustrations of discretization grids generated at different stages of the method for generating the discretization grid according to the present invention.
Figure 7B:
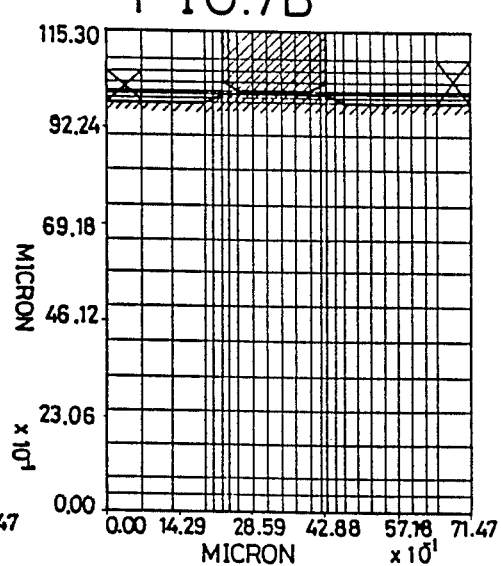
Figure 7C:
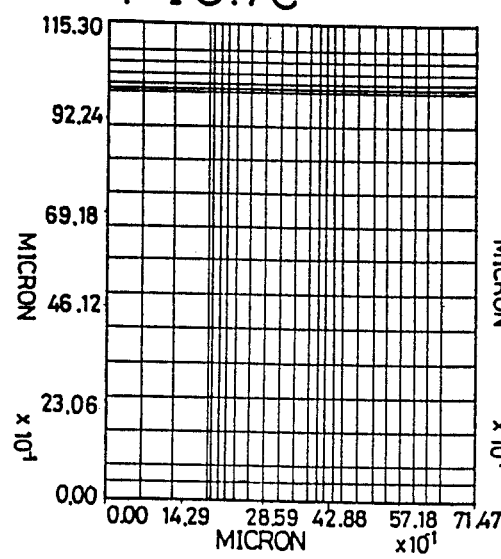
Figure 7D:
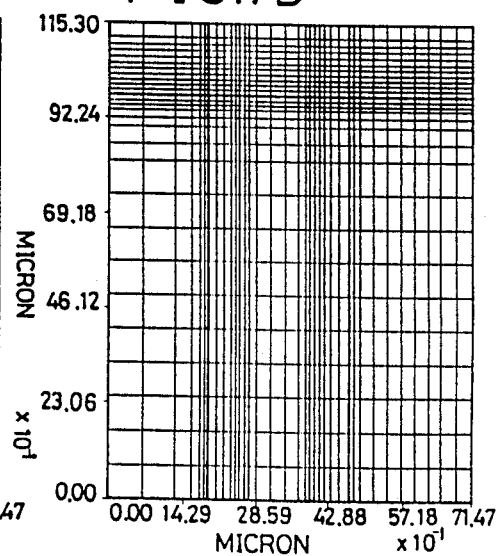

The discretization grids generated by such steps are shown in FIG. 7, where FIG. 7(A) shows the grid after the step 102, FIG. 7(B) shows the grid after the step 103, FIG. 7(C) shows the grid after the step 104, and FIG. 7(D) shows the grid after the process terminated. It is clear from FIG. 7 that the grid generated by this embodiment of the present invention is capable of more accurate simulation of a complicated polygonal figure.

As has been described, this embodiment is capable of generating the discretization grid which can simulate the complex configuration with improved accuracy. In particular, the requirements set out as the object of the present invention are all satisfied. Namely, in this embodiment:

(a) there is a grid point over each vertex of a cross-sectional figure of an object to be simulated;

(b) there is a grid point over each intersection of the grid and segments of the cross-sectional figure of the object that are not parallel to the grid;

(c) the grid becomes coarser or finer gradually;

(d) the grid is finer around boundaries of different materials;

(e) the grid is generated automatically.

Figure 8:
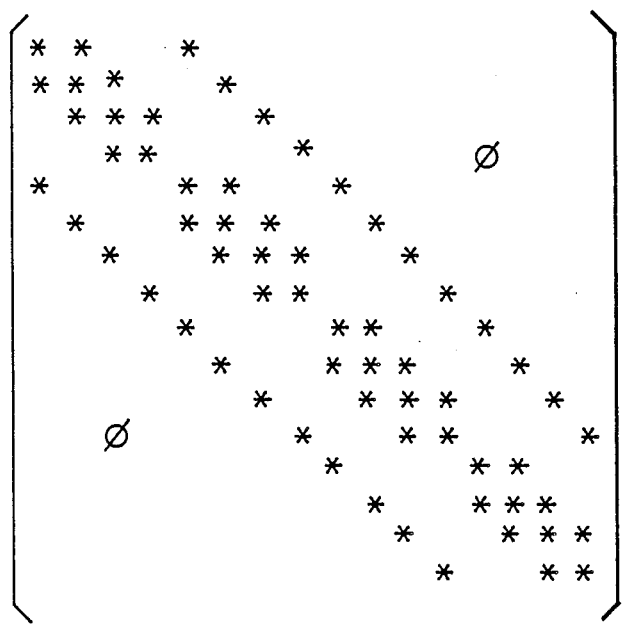
FIG. 8 is an illustration showing a matrix involved in calculations required by the method according to the present invention.

Furthermore, it can be seen from the description of the present invention in comparison with the prior art that since the grid generated by the present invention is parallel to orthogonal coordinate axes, matrices involved in the calculations for the simulation have the form shown in FIG. 8 in which the non-zero elements appears regularly, so that it is not necessary to have a computer with a larger memory capacity in order to perform the method of the present invention.

Moreover, it can easily be understood that although the preferred embodiment has been described for a simulation of a two dimensional semi-conductor device both for the sake of avoiding possible confusions and being definite, the method can be applied just as advantageously to a three dimensional object and an object of any physical nature so long as it has a definite cross-sectional configuration.

Besides these, many modifications and variations of this embodiment may be made without departing from the novel and advantageous features of the present invention. Accordingly, all such modifications and variations are intended to be included within the scope of the appended claims.

What is claimed is:

1. A method of evaluating the characteristics of a semiconductor device, comprising the steps of:
   (a) representing a cross section of the semiconductor device by a polygonal figure;
   (b) generating rectangular grids to locate one grid intersection point over each vertex of the polygonal figure;
   (c) generating additional rectangular grids in order to locate one grid point over each intersection of rectangular grids generated at step (b) and segments of the polygonal figure which are not parallel to lines of the rectangular grids generated at step (b); and
   (d) evaluating the characteristics of the semiconductor device on the grid points of the rectangular grids generated at steps (b) and (c).

2. The method of claim 1, further comprising the step of:
   (e) generating additional rectangular grids to locate one grid point over each intersection of the rectangular grids generated at step (c) and the segments of the polygonal figure which are not parallel to lines of the rectangular grids generated at the step (c), as well as to locate one grid point over each intersection of the rectangular grids generated at this step and the segments of the polygonal figure which are not parallel to lines of the rectangular grids generated at this step;
   wherein at step (d) the characteristics of the semiconductor device are also evaluated on the grid points of the rectangular grids generated at step (c).

3. The method of claim 2, further comprising the step of:
   (f) generating additional rectangular grids in a vicinity of boundaries between different materials contained in the semiconductor device;
   wherein at step (d) the characteristics of the semiconductor device are also evaluated on the grid points of the rectangular grids generated at the step (f).

4. The method of claim 3, further comprising the steps of:
   (g) generating additional rectangular grids to locate one grid point over each intersection of the rectangular grids generated at step (f) and the segments of the polygonal figure which are not parallel to lines of the rectangular grids generated at step (f);
   wherein at step (d) the characteristics of the semiconductor device are also evaluated on the grid points of the rectangular grids generated at step (g).

5. The claim of claim 4, further comprising the step of:
   (h) generating additional rectangular grids to locate one grid point over each intersection of the rectangular grids generated at step (g) and the segments of the polygonal figure which are not parallel to lines of the rectangular grids generated at step (g), as well as to locate one grid point over each intersection of the rectangular grids generated at this step and the segments of the polygonal figure which are not parallel to lines of the rectangular grids generated at this step; and
   wherein at step (d) the characteristics of the semiconductor device are also evaluated on the grid points of the rectangular grids generated at step (h).

6. The method of claim 1, further comprising the step of:
(i) generating additional rectangular grids such that each separation between adjacent lines of the rectangular grids generated at steps (b), (c) and this step has a ratio not greater than a prescribed value with respect to an adjacent separation; and
wherein at step (d) the characteristics of the semiconductor device are also evaluated on the grid points of the rectangular grids generated at step (i).

7. The method of claim 6, further comprising the step of:
(j) generating additional rectangular grids to locate one grid point over each intersection of the rectangular grids generated at stop (i) and the segments of the polygonal figure which are not parallel to lines of the rectangular grids generated at step (i);
wherein at step (d) the characteristics of the semiconductor device are also evaluated on the grid points of the rectangular grids generated at step (j).

8. The method of claim 7, further comprising the step of:
(k) generating additional rectangular grids to locate one grid point over each intersection of the rectangular grids generating at step (j) and the segments of the polygonal figure which are not parallel to lines of the rectangular grids generated at step (j), as well as to locate one grid point over each intersection of the rectangular grids generated at this step and the segments of the polygonal figure which are not parallel to lines of the rectangular grids generated at this step;
wherein at step (d) the characteristics of the semiconductor device are also evaluated on the grid points of the rectangular grids generated at step (k).

9. The method of claim 1, further comprising the steps of:
(1) calculating, for each pair of adjacent grid points, a quantity related to the physical properties of the semiconductor device; and
(m) generating additional rectangular grids in regions where the quantity calculated at step (1) varies from one pair of adjacent grid points to an adjacent pair of adjacent grid points by a value greater than a prescribed value;
wherein at step (d) the characteristics of the semiconductor device are also evaluated on the grid points of the rectangular grids generated at step (m).

10. The method of claim 9, further comprising the step of:
(n) generating additional rectangular grids to locate one grid point over each intersection of the rectangular grids generated at step (m) and the segments of the polygonal figure which are not parallel to lines of the rectangular grids generated at step (m);
wherein at step (d) the characteristics of the semiconductor device are also evaluated on the grid points of the rectangular grids generated at step (n).

11. The method of claim 10, further comprising the step:
(o) generating additional rectangular grids to locate one grid point over each intersection of the rectangular grids generated at step (n) and the segments of the polygonal figure which are not parallel to lines of the rectangular grids generated at step (n), as well as to locate one grid point over each intersection of the rectangular grids generated at this step and the segments of the polygonal figure which are not parallel to lines of the rectangular grids generated at this step; and
wherein at step (d) the characteristics of the semiconductor device are also evaluated on the grid points of the rectangular grids generated at step (o).

12. The method of claim 1, wherein at step (d) the grid points are represented by their coordinates with respect to a prescribed coordinated system in evaluating the characteristics of the semiconductor device.

13. The method of claim 12, wherein at step (d) all overlapping coordinates among the coordinates representing the grid points are removed, and all remaining coordinates representing the grid points are rearranged in a prescribed order after all of the overlapping coordinates are removed.

14. The method of claim 3, wherein at step (f) the boundaries between different materials contained in the semiconductor device are determined in accordance with material data containing information of the different materials contained in the semiconductor device.

15. The method of claim 11, wherein at step (i) the additional rectangular grids are generated such that one grid point is located on a mid-point of each separation between adjacent lines of the rectangular grids generated at the steps (b), (c) and (i), which as a ratio greater than a prescribed value with respect to an adjacent separation.

16. The method of claim 13, wherein two of the coordinates representing the grid points are considered overlapping when a distance between these two coordinates is less than a prescribed value.

17. The method of claim 1, wherein at step (d) the characteristics of the semiconductor device are evaluated on a basis of partial differential equations which are discretized by using the grid points of the rectangular grids generated at steps (b) and (c).

18. The method of claim 3, wherein at step (f) the different materials are the semiconductor and conductive materials of the semiconductor device proximate to each other.

* * * * *